(12) United States Patent
Osterried

(10) Patent No.: US 6,445,516 B2
(45) Date of Patent: Sep. 3, 2002

(54) LENS SYSTEM, IN PARTICULAR PROJECTION LENS SYSTEM IN SEMICONDUCTOR LITHOGRAPHY

(75) Inventor: Karlfrid Osterried, Aalen (DE)

(73) Assignee: Carl-Zeiss-Stiftung, Heidenheim (DE)

( * ) Notice: Subject to any disclaimer, the term of this patent is extended or adjusted under 35 U.S.C. 154(b) by 0 days.

(21) Appl. No.: 09/874,929

(22) Filed: Jun. 5, 2001

(30) Foreign Application Priority Data

Jun. 17, 2000 (DE) .......................................... 100 30 005

(51) Int. Cl.[7] ................................................ G02B 7/02
(52) U.S. Cl. ........................................ 359/819; 359/822
(58) Field of Search .................................. 359/819, 821, 359/822

(56) References Cited

U.S. PATENT DOCUMENTS

| | | | |
|---|---|---|---|
| 5,353,166 A | 10/1994 | Hanford et al. ............. | 359/819 |
| 5,838,478 A | 11/1998 | Hippenmeyer et al. ..... | 359/198 |
| 5,852,518 A | * 12/1998 | Hatasawa et al. ........... | 359/822 |
| 5,973,863 A | * 10/1999 | Hatasawa et al. ........... | 359/823 |
| 6,122,114 A | * 9/2000 | Sudo et al. ................. | 359/819 |

FOREIGN PATENT DOCUMENTS

| | | |
|---|---|---|
| DE | 37 30 094 A1 | 12/1988 |
| EP | 0 789 280 A2 | 8/1997 |
| EP | 1 037 266 A1 | 9/2000 |

* cited by examiner

*Primary Examiner*—Ricky Mack
(74) *Attorney, Agent, or Firm*—Welsh & Katz, Ltd.

(57) ABSTRACT

In the case of a lens system, in particular a projection lens system in semiconductor lithography, with a plurality of optical elements, such as lenses, which are mounted in mounts, the mounts being connected to one another, if appropriate by means of adjusting rings, at least one inner mount of an optical element which is intended for removal and/or later fitting is connected to an outer mount by means of a three-point mounting.

21 Claims, 3 Drawing Sheets

LENS SYSTEM, IN PARTICULAR PROJECTION LENS SYSTEM IN SEMICONDUCTOR LITHOGRAPHY

BACKGROUND OF THE INVENTION

The invention relates to a lens system, in particular a projection lens system in semiconductor lithography, of the type defined more specifically in the preamble of claim 1.

In U.S. Pat. No. 5,353,166 there is a description of a projection lens system which comprises a stack mount with very solid individual parts. The rigidity of the solid parts is intended to achieve the effect that the separating surface is not deformed. The separation and a reconnection are consequently highly reproducible. The connection surfaces are in this case precision-ground. The lens system is also provided with intermediate rings or adjusting rings.

With high-performance lens systems, as is the case for example with projection lens systems in semiconductor lithography, it must be possible for residual imaging errors following an adjustment of the lens system to be minimized.

However, there is the risk of the imaging quality of lens systems of this type being altered by mechanical influences of known mounting techniques when mounted lenses are later removed and fitted. This is caused, for example, by the adjusting rings becoming loose when an air clearance is opened, by intercalated Teflon grease, by flatness errors of mounts and adjusting rings and by different tightening torques at the screws by which the outer mounts are connected to one another.

This means that, during removal and fitting of the same lens, or of another lens, fitting errors may occur as new errors and invalidate the desired improvement, and in some circumstances even impair the quality. The present invention is therefore based on the object of providing a lens system of the type mentioned at the beginning in which no new errors occur after a lens has been exchanged and refitting carried out, or by means of which reproducible refitting is achieved.

SUMMARY OF THE INVENTION

This object is achieved according to the invention by the features stated in the defining clause of claim 1.

The three-point mounting according to the invention allows complete isolation in terms of deformation and precise mounting, so that, even in the case of removal and subsequent refitting, reproducible conditions and/or a precise fitting position of the newly fitted optical element, such as for example a lens, which is identical to the previous position, are/is achieved.

The three-point mounting may be formed by three bearing bodies which are arranged in the outer mount and are provided with spherical bearing surfaces which are mounted in or on bearing locations of the inner mount.

Suitable for this purpose are, for example, three bearing locations which are formed by a planar supporting location, a channel-shaped supporting location and a fixed-point support.

According to the invention, in this case the continuation of the longitudinal axis of the channel-shaped supporting location should run through the fixed-point support, which may be formed by a conical receiving part. In this way, a very precisely defined position is created.

High positional reproducibility can be achieved by the use of hard metal elements and a solution with balls situated below or in the outer mount. The three-point mounting is self-centering during removal/fitting on account of the dead weight of the mounted lens. This means that, for example, the newly fitted lens no longer has to be recentered as a correction element itself, which further improves the reproducibility and also simplifies the fitting work.

Lens systems in semiconductor lithography are generally not tilted and also do not fall over. For this reason, no special fixing would be required. However, for safety reasons, the inner mount should be provided with a securing device preventing significant displacement or falling out. However, it is important here that no forces are transferred to the optical element, for example the lens. This may be carried out for example by means of an air gap of several micrometers or by a layer of adhesive, which however must not exert any pressure.

BRIEF DESCRIPTION OF THE DRAWINGS

Advantageous developments and refinements of the invention emerge from the remaining subclaims and from the following exemplary embodiments described in principle with reference to the drawing, in which:

DETAILED DESCRIPTION OF THE PREFERED EMBODIMENT

Figure 1:
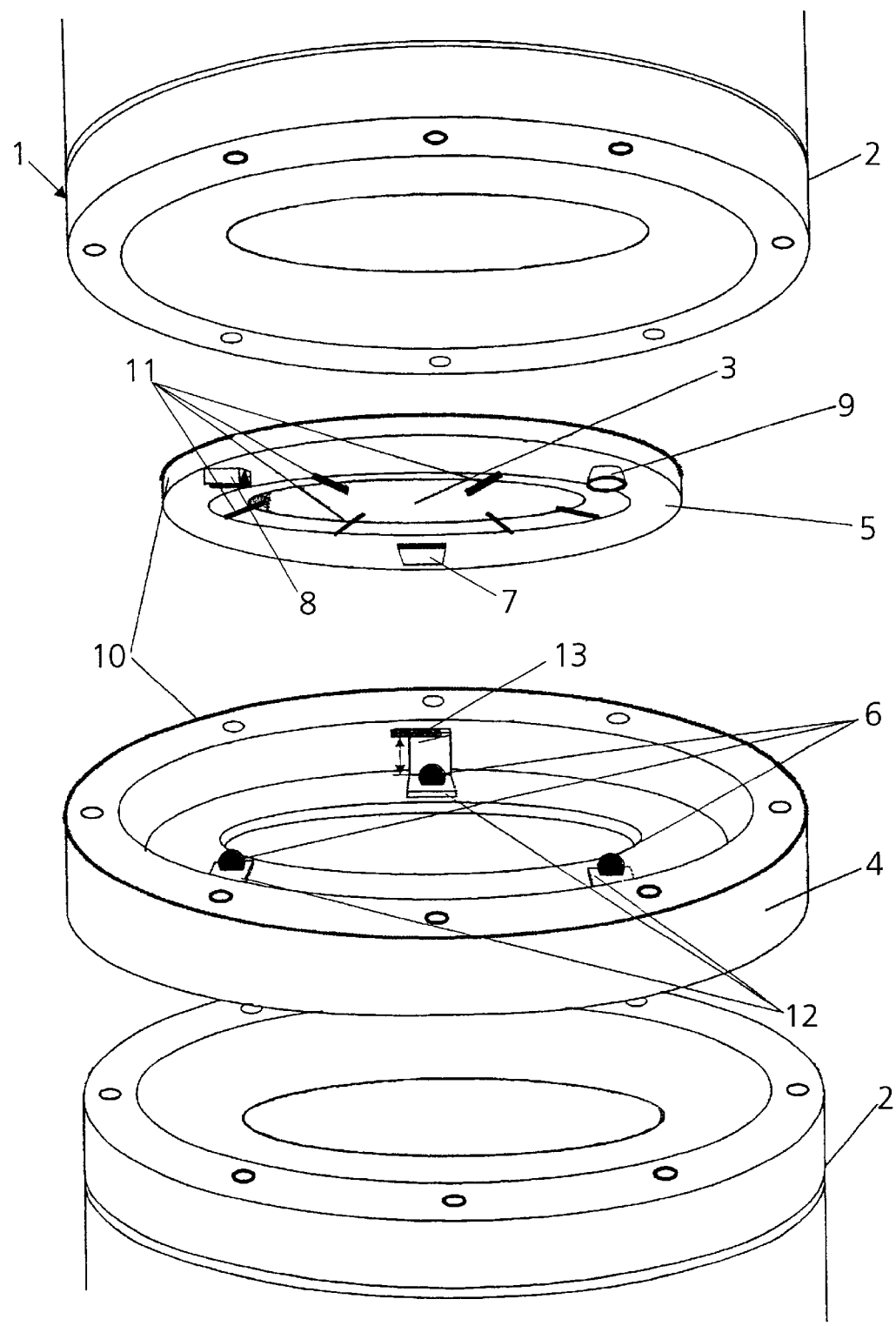
FIG. 1 shows an exploded representation of the three-point mounting according to the invention.

In a lens system 1, a plurality of outer mounts 2 are arranged one above the other in a known way and are connected to one another by screws, in a way not represented in any more detail. An exchangeable lens, for example a correction lens 3, can be mechanically centered in relation to the optical axis by means of an outer mount 4. If the correction lens 3 is to be set directly in the main flange of the lens system, the outer mount 4 can be adapted to the main flange. The correction lens 3 is connected to an inner mount 5 in a known way by directional adhesive bonding. For this purpose, the inner mount 5 bears on the underside a sensing collar 10, which, along with a further sensing collar 10 on the outer circumference of the outer mount 4, is measured for tilting.

The outer mount 4 can be integrated, with or without the lens 3, into the system of the remaining stack mounts with the outer mounts 2. In this way, the correction lens 3 can be used to compensate for image errors.

On the upper side of the outer mount 4 there are three hard metal balls as bearing bodies 6.

The inner mount 5 with the lens 3 as a correction element is mounted by its own weight on the three hard metal balls 6. For this purpose, the inner mount 5 bears on its underside a planar supporting location 7, a channel-shaped supporting location 8 and a fixed-point support 9, which is formed by a conical receptacle. The correction lens 3 is connected to the inner mount 5 in a known way by spring legs 11, which are arranged such that they are distributed around the circumference.

As can be seen, the hard metal balls 6 do not lie directly on the outer mount 4 but are positioned in base elements 12, which are located under the balls 6. Instances of tilting of the inner mounts 5 can be avoided or eliminated by thickness corrections of the abase elements 12. Instead of an arrangement of the base elements 12 under the balls 6, they may also be located behind the planar supporting location 7, the channel-shaped supporting location 8 and the fixed-point support 9.

The corrective presetting can be determined according to known methods by contacting the tilting collars 10 in a sensing manner. The base elements 12 can be brought to a correct thickness by lapping. Even if safety clips 13 are fitted on the base elements 12, or connected to them, as a safety device, an allowance H of the safety clips 13 is not changed by a tilting correction. The safety clip, which is for example swung or pushed in from an inactive position onto the three balls 6 after the planar mount 5 has been placed on, serves as a securing means to prevent significant displacement or falling out of the inner mount 5. Generally at least two, or better three, safety clips 13 are provided, distributed over the circumference. In order that no forces are transmitted to the lens 3, however, there should be an air gap of several micrometers with respect to the inner mount 5. The air gap can be easily checked for example with the aid of a metal foil. Since the adjustment is not made by means of the inner mount 5, the height H of the safety clip 13 can be adapted exactly to the allowance of the inner mount 5.

To adapt the outer mount 4 to the outer mounts 2, the conical receptacle 9 of the inner mount 5 may, if appropriate, also be made such that it can be centered or set. The three-point mounting also reduces the natural frequency of the correction lens 3. If this is not in conformity with mechanical specifications, the natural frequency can be increased by reinforcing the inner mount 5.

For fitting, the correction lens 3 is set in the prefitted outer mount 4. The sensing collars 10 are measured for tilting, it being possible for a thickness correction of at most two base elements 12 to be determined and, if appropriate, for a correction to be carried out. Unlike the known directional adhesive bonding method, in this way a residual tilting of the lens 3 after adhesive bonding can be corrected.

In its basic version, the three-point mounting according to the invention is based on the adjustment of the air clearances between the lenses taking place as before by means of adjusting rings. This means that, when the correction lens is removed, an adjusting ring becomes free, the refitting of which entails reproducibility errors.

An improvement in the three-point mounting may comprise separating the adjustment from the sealing. This means dispensing with an adjustment by means of the outer mount 4 of the inner mount 5 and carrying out the adjustment via the base elements 12.

For the adjustment, the base elements 12 may either be remachined, for example by lapping, or else be exchanged. However, the base elements 12 may also in each case contain a stack of layers of metal foils of different individual thicknesses, whereby changes in thickness (for adjustment and tilting correction) can be achieved particularly easily by removing or adding foils.

To sum up, the following advantages are obtained by the three-point mounting of the type described above:
- complete isolation in terms of deformation between the outer mount 4 and the inner mount 5
- extremely high bearing reproducibility in tilting and translation residual tilting after directional adhesive bonding of the lens 3 can be corrected completely.

In addition, there is little handling effort, since the mounting is self-centering, there is no longer any need for an adjusting ring to be securely screwed, aligned and oriented, no Teflon grease is required, and the weight is lower. In the prior art, to improve reproducibility heavy lens blocks had to be moved.

To remove the correction lens 3, the lens system 1 has to be opened only at one location.

The three-point mounting described above can be realized at a number of locations in the lens system 1.

Existing mounts comprising stacked outer mounts 2 can be converted without any problem into a correction module with a correction lens 3. On the mechanical side, there is no limitation with regard to the number and sequence of correction modules. It goes without saying that not only correction lenses but also correction mirrors or other optical elements are possible as correction modules. The three-point mounting described can also be used as a standard mounting technique in order to use the advantages of complete isolation in terms of deformation and tilting correction. An extension may also comprise changing the distance between lenses by means of the base elements 22 instead of by means of the known adjusting rings.

Figure 2:
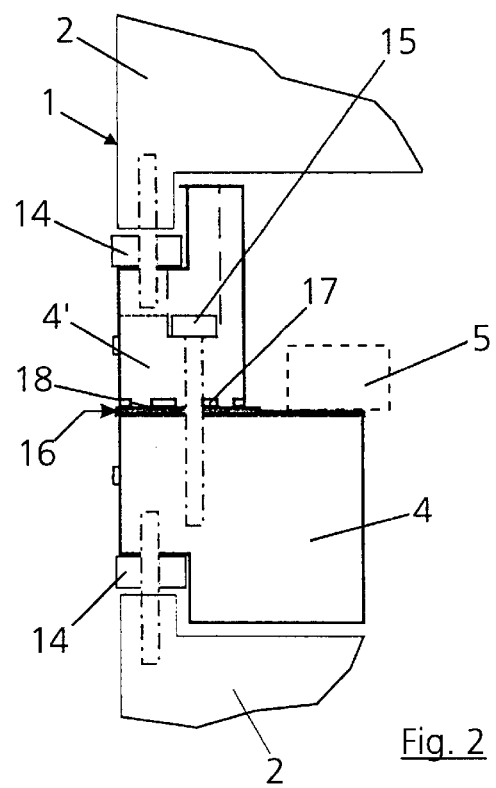
FIG. 2 shows an outer mount with conventional adjusting rings.

In FIG. 2, a mounting technique is represented with outer mounts 4 and conventional adjusting rings 14 lying in between. In the known mounting technique, the removal of a correction lens 3 also has the effect that adjusting rings 14 become free, whereby a total of eight separating surfaces are produced. After refitting, the imaging quality is therefore measurably changed, to be precise by the following influences:
- register errors of the eight separating surfaces (adjusting rings and mount flanges)
- separating surfaces are susceptible to non-reproduced inclusion of dust/contaminants
- Teflon grease which has been applied for sealing forms a film of finite thickness and can no longer be applied reproducibly
- screws
- tightening torques produce very high pressing forces and distort the mounts.

According to the exemplary embodiment as shown in FIG. 2, the mounting technique for the removal of a correction lens 3 with its inner mount 5 (represented only by dashed lines) comprises two outer mounts 4 and 4' and one inner mount 5, in which the correction lens 3 is held. To open the lens system 1 for removal of the correction lens, the lower outer mount 4 is separated from the outer mount 4', which are connected directly to each other—without an adjusting ring—by means of screws 15. In this way, the number of open separating surfaces caused by a removal can be drastically reduced. When the inner mount 5 is fitted by means of the three-point mounting represented in FIG. 1, consequently the number of separating surfaces is reduced from eight to two. Non-reproducible fitting influences can be further reduced by lapped contact surfaces and by dry sealing without Teflon grease.

The upper mount part 4' acts in this case only as a spacer ring, in order that the upper adjusting ring 14 does not become free when the lens system is opened at the separating surface 16.

The upper mount part 4' may have relief grooves 17 on the underside, and the surfaces lying in between are formed as lapped surfaces 18. An air clearance adjustment may be integrated into the outer mounts 4' and 4.

Figure 3:
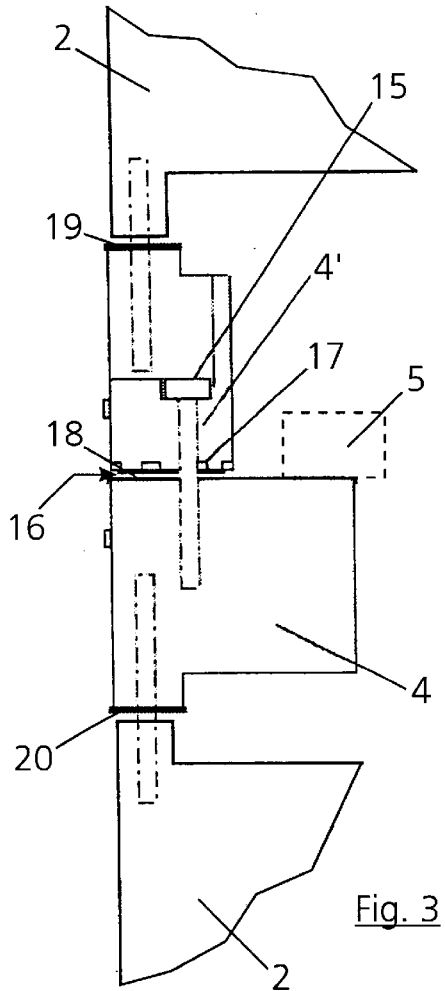
FIG. 3 shows an outer mount with an integrated adjusting function.

The outer mount technique represented in FIG. 3 is fundamentally of a similar construction to that represented in FIG. 2. According to FIG. 3, the outer mount 4' in this case also has the function of an adjusting ring. In practice, the outer mount 4' represents an overdimensioned adjusting ring. Further functional surfaces 19 and 20 are respectively located between the upper outer mount 2 and the mount 4' and between the lower outer mount 2 and the mount 4. The surfaces 19 and 20 are ground to size as part of the adjusting process. The advantage of the embodiment as shown in FIG. 3 over that as shown in FIG. 2 is that, with a limited overall space, the mounts 4 and 4' can be designed such that they are higher, and consequently more rigid. The impairment of the quality of the register of the functional surfaces caused by fitting is consequently less.

Figure 4:
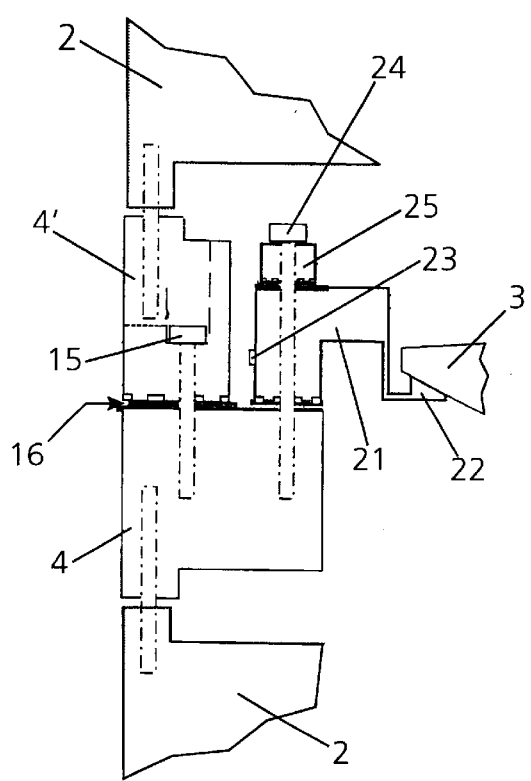
FIG. 4 shows an inner mount using a screwing technique.

The exemplary embodiment represented in FIG. 4 corresponds essentially to that represented in FIG. 3. However, instead of a three-point mounting for the inner mount 5 of the correction lens 3, here a conventional mount with a deformation-isolated inner mount 21 with spring legs 22 is provided. In this arrangement, the inner mount 21 is screwed to the mount 4 by means of lapped surfaces. The inner mount 21 is centered by means of a centering collar 23. It is of advantage in this case if all the contact surfaces are lapped. For this purpose, a small lapped block 25 is also respectively arranged between the inner mount 21 and the screws 24 which are distributed over the circumference and by means of which the inner mount 21 is connected to the mount 4. Instead of individual small blocks 25, a continuous, lapped ring may also be provided.

Figure 5:
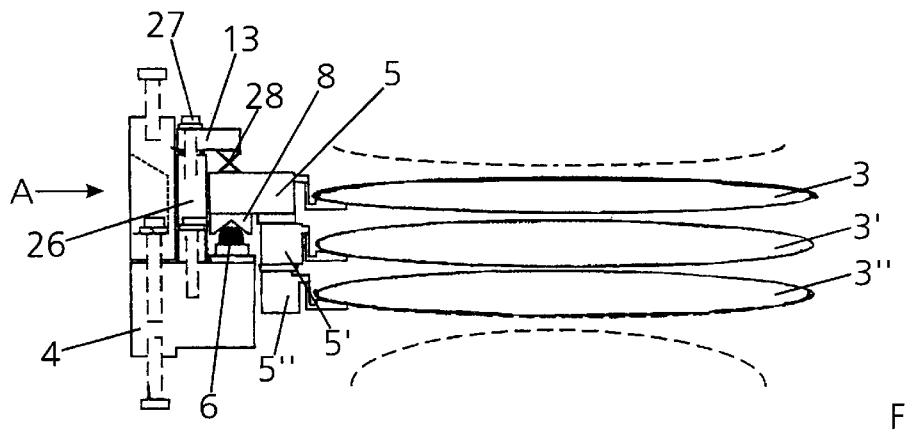
FIG. 5 shows a securing device for an assembly of lenses with the three-point mounting according to the invention.
Figure 6:
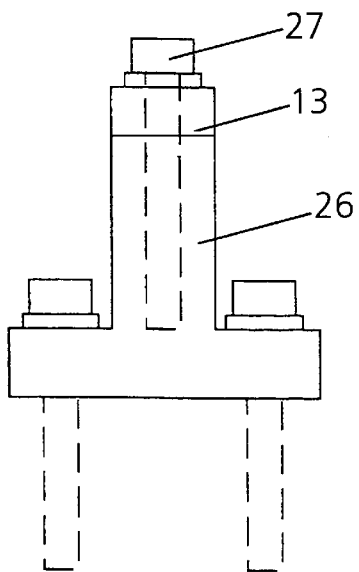
FIG. 6 shows a side view from the direction of the arrow A of FIG. 5 of a bearing block.

Represented in FIG. 5 is a securing device for a set of three lenses, the three lenses 3, 3' and 3" being connected jointly to an outer mount 4 by means of a three-point mounting of the inner mount 5. As can be seen, the clip 13 is arranged on a block 26. Two or three blocks of this type are in this case arranged such that they are distributed over the circumference and are connected to the mount 5 by means of screws 27.

Both the inner mount 4 and the clip 13 may be provided with spherical or conical extensions 28, in order to set a precisely defined distance or clearance between the two parts. If need be, adhesive filling may also be introduced into the distance. It is just important that no deformation forces are applied to the inner mount 4 via the securing device.

The remaining construction of the mounting technique corresponds to the type described in the previous exemplary embodiments.

Figure 7:
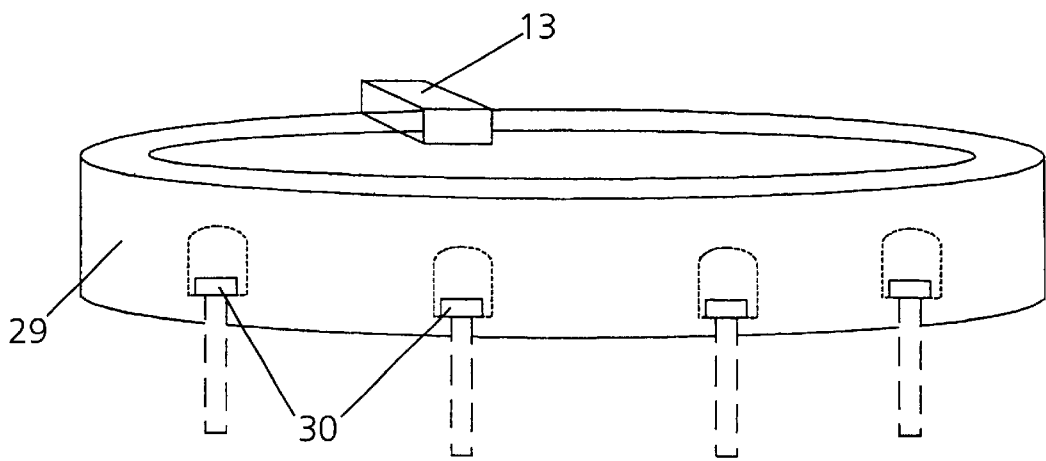
FIG. 7 shows a reinforcing ring with a securing device.

Instead of individual blocks 26, a reinforcing ring 29 may also be provided for the same purpose (see FIG. 7), said ring being connected to the outer mount 5 by means of screws 30 arranged such that they are distributed over the circumference. At least one clip 13, or better two or three clips 13, arranged on the upper side of the reinforcing ring 29, again establish the securement to prevent falling out of the inner mount 4. If appropriate, the clips 13 can be swung in and out or pushed in and out for fitting and removal.

As can also be seen from FIG. 5, although the lenses 3' and 3" are likewise mounted in inner mounts 5' and 5" by means of supporting feet 22, the two inner mounts 5' and 5" are connected jointly to the inner mount 5, if appropriate by means of screw connections. This means that all three lenses 3, 3' and 3" are positioned jointly in an exact and reproducible manner by the three-point mounting during fitting and removal of the inner mount 5.

Within the scope of the invention, the term mount or outer mount is to be understood in a very general sense. Apart from the usually customary directing adhesive mounts, it goes without saying that it is also to be understood as meaning screwing/clamping mounts, directional rotary mounts, pneumatic mounts and the like.

What is claimed is:

1. A lens system with a plurality of optical elements, which are mounted in inner mounts and outer mounts, wherein the inner mounts are connected to the outer mounts, the outer mounts being connected to one another wherein at least one inner mount of an optical element is connected to an outer mount by a three-point mounting; which establishes a precise and reproducible position of the inner mount.

2. The lens system as claimed in claim 1, wherein the optical element is a lens.

3. The lens system as claimed in claim 1, wherein the three-point mounting is formed by three bearing bodies which are provided with spherical bearing surfaces which are mounted in bearing locations of the inner mount or of the outer mount.

4. The lens system as claimed in claim 3, wherein the bearing bodies are arranged on the outer mount and wherein the bearing locations are located in the inner mount.

5. The lens system as claimed in claim 3, wherein the bearing bodies are arranged on the outer mount and wherein the bearing locations are located on the inner mount.

6. The lens system as claimed in claim 2, wherein the three bearing locations are formed by a planar supporting location, a channel-shaped supporting location and a fixed-point support.

7. The lens system as claimed in claim 6, wherein the continuation of the longitudinal axis of the channel-shaped support runs through the fixed-point support.

8. The lens system as claimed in claim 6, wherein the fixed-point support is designed as a conical supporting part.

9. The lens system as claimed in claim 3, wherein the bearing bodies are formed by balls.

10. The lens system as claimed in claim 3, wherein the bearing bodies (balls) rest in a height-adjustable manner on base elements which are connected to the outer mount.

11. The lens system as claimed in claim 1, wherein the inner mount is provided with a securing device to prevent axial displacement.

12. The lens system as claimed in claim 11, wherein the securing device has at least one clip, which is arranged such that it is distributed over the circumference and which lies in a pressureless manner over the inner ring.

13. The lens system as claimed in claim 11, wherein the securing device has three clips, which are arranged such that they are distributed over the circumference and which lie in a pressureless manner over the inner ring.

14. The lens system as claimed in claim 12, wherein the clips lie with a clearance over the inner mount.

15. The lens system as claimed in claim 12, wherein the clips lie with a clearance over a part connected to the inner mount.

16. The lens system as claimed in claim 12, wherein a layer of adhesive is arranged between the clips and the inner mount or a part connected to the inner mount.

17. The lens system as claimed in claim 12, wherein the clips are arranged on three bearing blocks which are arranged such that they are distributed over the circumference and which are connected to the outer mount.

18. The lens system as claimed in claim 12, wherein the clips are arranged on a reinforcing ring which encloses the inner mount and which is connected to the outer mount.

19. The lens system as recited in claim 1, wherein the plurality of optical elements are connected to one another by intermediate mounts and are fastened jointly to an inner mount which is connected to the outer mount by means of the three-point mounting.

20. The lens system as claimed in claim 1, wherein the lens system is a projection lens system in micro lithography.

21. The lens systems of claim 1, wherein the inner mounts are connected to the outer mounts by adjusting rings.

* * * * *

UNITED STATES PATENT AND TRADEMARK OFFICE
CERTIFICATE OF CORRECTION

PATENT NO.     : 6,445,516 B2
DATED          : September 3, 2002
INVENTOR(S)    : Osterried It is certified that error appears in the above-identified patent and that said Letters Patent is hereby corrected as shown below:

<u>Title page,</u>
Item [73], Assignee, "Carl-Zeiss-Stiftung" should be -- Carl-Zeiss-Stiftung trading as Carl Zeiss --;

<u>Column 3,</u>
Line 5, "the abase" should be -- the base --;

<u>Column 4,</u>
Line 24, "elements 22" should be -- elements 12 --;

<u>Column 6,</u>
Line 10, ";" should be -- , --;

<u>Column 8,</u>
Line 1, "lens systems" should be -- lens system --.

Signed and Sealed this

Seventeenth Day of December, 2002

JAMES E. ROGAN
*Director of the United States Patent and Trademark Office*